United States Patent [19]

Harry et al.

[11] Patent Number: 4,783,625

[45] Date of Patent: Nov. 8, 1988

[54] WIDEBAND HIGH IMPEDANCE CARD MOUNTABLE PROBE

[75] Inventors: Emory J. Harry, Aloha, Oreg.; Matthew J. Hadwin, Battleground; John D. Garcia, Vancouver, both of Wash.

[73] Assignee: Tektronix, Inc., Beaverton, Oreg.

[21] Appl. No.: 170,606

[22] Filed: Mar. 14, 1988

Related U.S. Application Data

[63] Continuation of Ser. No. 898,477, Aug. 21, 1986.

[51] Int. Cl.[4] .................. G01R 1/06; G01R 31/02
[52] U.S. Cl. .................... 324/158 P; 324/158 F; 324/73 PC; 324/72.5
[58] Field of Search .......... 324/158 F, 158 P, 73 PC, 324/72.5; 439/260, 169; 361/412, 427

[56] References Cited

U.S. PATENT DOCUMENTS

| | | | |
|---|---|---|---|
| 2,918,646 | 7/1957 | Davidson | 439/169 |
| 4,727,319 | 2/1988 | Shahriary | 324/158 F X |
| 4,749,942 | 6/1988 | Sang et al. | 324/158 P X |

Primary Examiner—Reinhard J. Eisenzopf
Assistant Examiner—Vinh P. Nguyen
Attorney, Agent, or Firm—William O. Geny; Francis I. Gray

[57] ABSTRACT

An active electrical test probe with wideband frequency capability for use on a test probe card, along with other test probes. A small hybrid integrated circuit is mounted on a substrate held on edge, adjacent the probe tip contact element of the probe, by a conductive metal clip. The circuit is provided power from an external source. Signals received by the probe tip are transmitted, as modified by the hybrid integrated circuit, through an output cable to electronic test equipment.

4 Claims, 2 Drawing Sheets

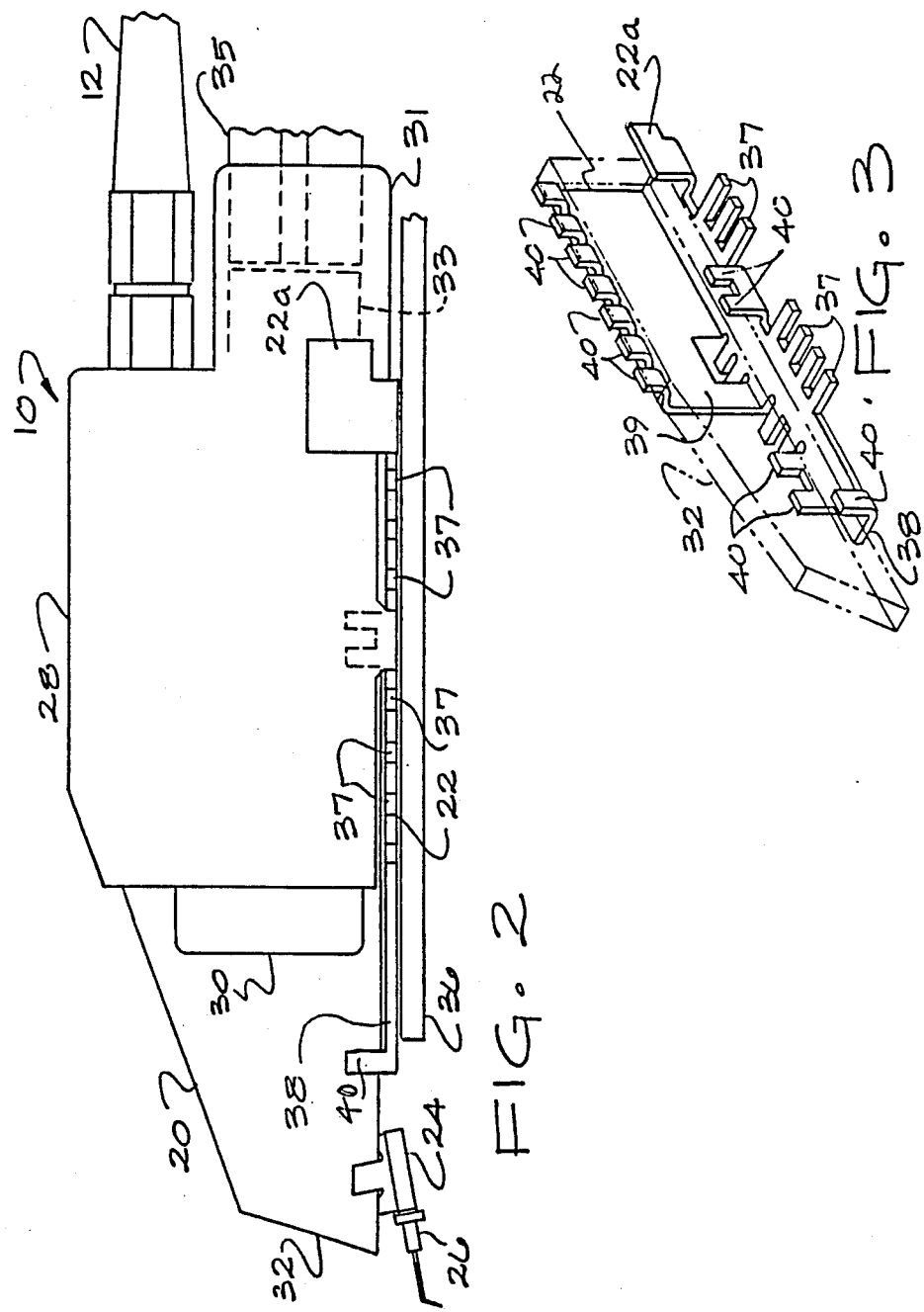

WIDEBAND HIGH IMPEDANCE CARD MOUNTABLE PROBE

This is a continuation of application Ser. No. 898,477 filed Aug. 21, 1986.

BACKGROUND OF THE INVENTION

The following invention relates to probes for use with electronic test instruments for testing circuit components such as integrated circuits and circuit elements of hybrid circuits.

Conventionally, integrated circuits and hybrid circuits are tested by placing those circuits in a chuck which is then positioned relative to a probe card which contains a plurality of probes soldered or attached to the card in predetermined positions so as to make contact with certain desired portions of the circuit under test. The probe cards are planar mounting boards having a central aperture about which the various probes are mounted. Transmission lines such as coaxial cables are attached to each of the probes and their opposite ends are then connected to a test instrument for gathering data sensed by the probes.

The probes that are mounted and used in this manner are either DC probes (probes that can measure only at very low frequencies) or are characteristically low impedance probes which are wideband probes but whose input impedance is typically on the order of 50 ohms. The DC probes are incapable of measuring high frequency phenomena and, the low impedance probes load the circuit under test and interfere with the parameter that is to be measured.

High impedance probes having the proper bandwidth are available; however, these must include active circuitry. Currently such probes comprise a housing which is intended to be hand-held and a probe tip protruding from the housing. Such probes cannot easily be usd with probe cards because of the size and configuration of the circuit elements which must be contained within the housing. To the extent that such probes can be adapted to be physically attached to probe cards, such arrangements are awkward and their size interferes with adjustments that are sometimes made to the circuit under test. These adjustments frequently take the form of laser trimming and the probe frequently masks the area where the laser should be applied.

SUMMARY OF THE INVENTION

The difficulties of the previously known active test probes are overcome by the present invention which provides a high impedance wideband probe which comprises an electronic circuit mounted on a substrate for providing the probe with its high impedance and wideband capability. The substrate is held within a clip which holds the circuit in a predetermined orientation when the clip is mounted to a probe card. The circuit has a terminus for a probe tip for making electrical contact with the device under test.

Other features of the invention include a probe tip which may be selectively removable, thus facilitating replacement when it becomes dull through repeated usage. The circuit may be a hybrid circuit mounted on an alumina substrate. The substrate carrying the hybrid circuit may be mounted vertically in the clip to save space and to avoid masking of the device under test. The probe may further include a housing disposed about at least a portion of the circuit held within the clip so that the entire probe may be manipulated without the possibility of damage to the substrate or any circuit element.

The clip may be a conductive metal, and as such may provide a means for connecting the hybrid circuit to ground. A portion of the clip may be made available to a detachable clamp connected to ground, or a ground connection may be provided through the probe card to which the clip is soldered or fastened down by screws.

It is a principal object of this invention to provide a wideband, high impedance probe capable of being mounted on a probe card.

A further object of the present invention is to provide a probe mounted on a probe card which will not mask the device under test during testing procedures.

A still further object of this invention is to provide a wideband, high impedance probe that is durable and may withstand repeated handling.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 2 is a side view of a portion of the probe shown in FIG. 1.

FIG. 3 is a perspective view of a mounting clip for mounting the probe to a probe card, with a hybrid circuit shown in phantom outline.

DETAILED DESCRIPTION OF THE INVENTION

Figure 1:
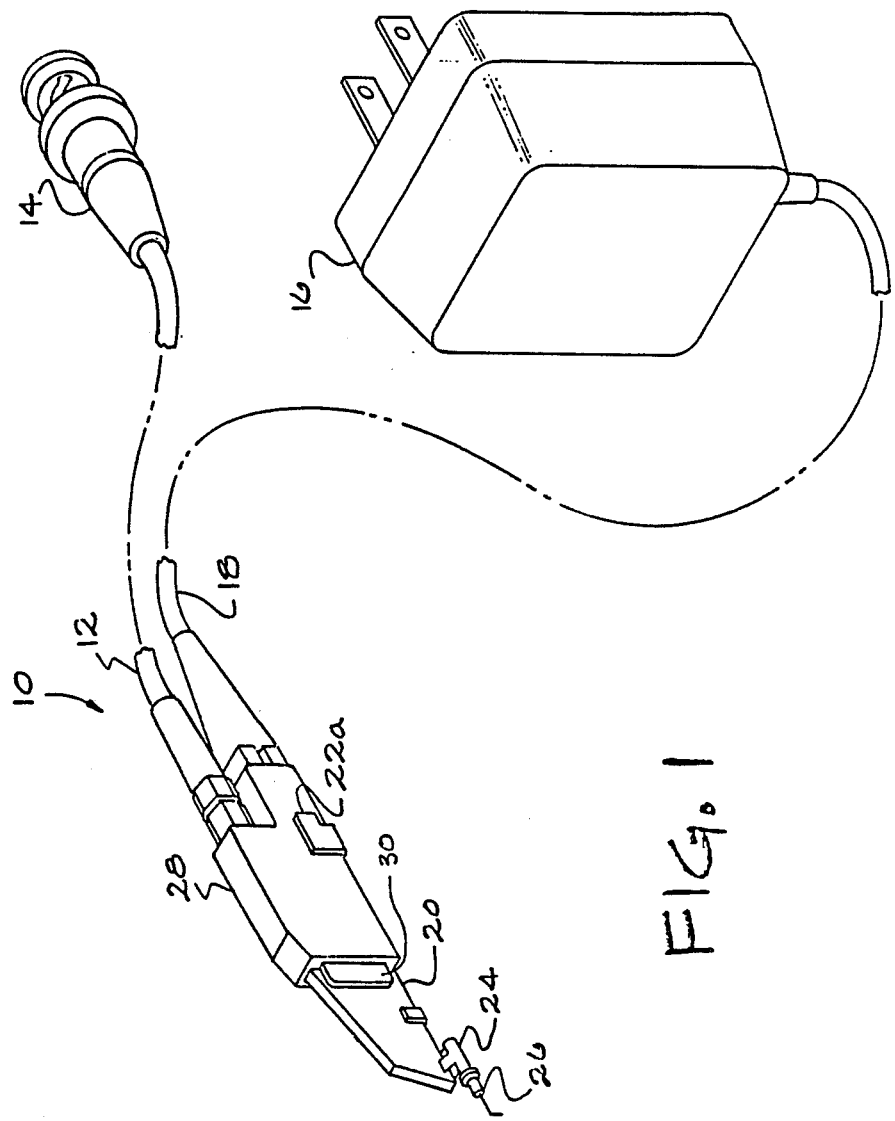
FIG. 1 is a perspective view of a probe constructed according to the present invention.

A wide band high impedence card-mountable probe 10 includes a connecting cable 12 having a terminating plug 14 for connecting the probe 10 to an electronic instrument (not shown). The probe 10 is powered by a DC power supply 16 which is connected to the rear of the probe by a cable 18. A hybrid circuit 20 is vertically mounted in a clip 22 which may be soldered or fastened by screws to a probe card 36 (see FIG. 2). Connected to the hybrid circuit 20 is a probe tip receptable 24 which is essentially a hollow cylinder for receiving a replaceable probe tip 26. The probe 10 may include a plastic housing 28 which may enable a user to manipulate the probe 10 without touching the hybrid circuit 20. The hybrid circuit 20 may also include a ceramic cover 30 for protecting IC chips which may be mounted on the alumina substrate 32. The housing 28 contains a rear receptacle 31 which houses an input jack 33 (shown in phantom in FIG. 3).

Referring to FIG. 3, masking of the device under test (not shown) is prevented by utilizing a planar alumina substrate 32 upon which is printed an integrated circuit 20 which is vertically oriented within the clip 22. The clip 22 includes a flange portion 38 which rests flat on the probe card 36 and an upright portion 39. The flange portion 38 includes solder lugs 37 which may be used to solder the clip 22 to the probe card 36. A ground lug 22a extends to the rear of clip 22 and provides access for a ground clamp (not shown) to be connected to the clip 22. The substrate 32 is held within the clip 22 by vertical solder lugs 40 extending both from upright portion 39 and flange portion 38 so that it is vertically oriented with respect to the probe card 36.

The hybrid circuit 20 may be any conventional circuit for providing a probe with a wide bandwidth frequency response characteristic and a high input impedance. Such circuits are well known in the art.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A high impedance wideband probe for an electronic test instrument comprising:
   (a) a rigid thin supporting substrate having an electrical circuit imprinted thereon for providing said probe with a high input impedance;
   (b) a probe card;
   (c) a clip mounted to said probe card, said clip including a flanged portion resting on said probe card and an upright support portion, said upright support portion extending at a right angle to said flanged portion for holding said substrate in a substantially vertical orientation relative to said probe card, wherein said flanged portion includes mounting lugs for attachment to said probe card; and
   (d) probe tip means, disposed at a forward end of said substrate, connected electrically to said circuit, for making electrical contact with the device under test and including a probe tip receptacle for receiving a selectively replaceable probe tip.

2. The probe of claim 1 wherein said circuit is a hybrid circuit mounted upon an alumina substrate.

3. The probe of claim 2 further including a housing disposed about at least a portion of said circuit for enabling said probe to be manipulated without touching said substrate.

4. The probe of claim 1 wherein said clip includes a ground lug for providing a low inductance path from said electrical circuit to ground.

* * * * *